(12) United States Patent
Hirohashi et al.

(10) Patent No.: US 7,649,746 B2
(45) Date of Patent: Jan. 19, 2010

(54) SEMICONDUCTOR DEVICE WITH INDUCTOR

(75) Inventors: Osamu Hirohashi, Nagano (JP); Tomonori Seki, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 0 days.

(21) Appl. No.: 11/701,357

(22) Filed: Feb. 2, 2007

(65) Prior Publication Data
US 2008/0186008 A1 Aug. 7, 2008

(51) Int. Cl.
*H05K 7/00* (2006.01)
(52) U.S. Cl. ............... 361/760; 257/666; 257/667; 257/668
(58) Field of Classification Search ........... 361/760, 361/761; 257/704, 666–668
See application file for complete search history.

(56) References Cited

U.S. PATENT DOCUMENTS 6,975,200 B2 * 12/2005 Nakao et al. ............... 336/200
7,230,316 B2 * 6/2007 Yamazaki et al. .......... 257/531
2005/0051870 A1 * 3/2005 Yamazaki et al. .......... 257/531

FOREIGN PATENT DOCUMENTS

| JP | H11-251157 | 9/1999 |
| JP | 2004-007017 | 1/2004 |
| JP | 2004-072815 | 3/2004 |
| JP | 2004-274004 | 9/2004 |

\* cited by examiner

*Primary Examiner*—Dean A. Reichard
*Assistant Examiner*—Abiy Getachew
(74) *Attorney, Agent, or Firm*—Manabu Kanesaka

(57) ABSTRACT

A semiconductor device with an inductor device is small, thin, and low-cost. A laminated inductor is adhered fixedly onto a supporting conductive plate by Ag paste, and a semiconductor chip is adhered fixedly onto the laminated inductor via an insulating DAF tape. One end of the supporting conductive plate and a terminal electrode of the semiconductor chip are connected by a metal wire, and a plurality of terminal electrodes of the semiconductor chip and a plurality of external lead-out terminals are connected respectively by laterally extending metal wires. The entire structure is then sealed by a resin mold. By employing a laminated inductor and forming the metal wires to extend laterally in this manner, the thickness of the semiconductor device with an inductor can be reduced.

12 Claims, 5 Drawing Sheets

SUSPENSION LEAD

SEMICONDUCTOR DEVICE WITH INDUCTOR

BACKGROUND OF THE INVENTION AND RELATED ART STATEMENT

The present invention relates to a semiconductor device constituting a DC/DC converter installed in a portable electronic instrument or the like, and more particularly to a small, thin semiconductor device with an inductor formed by laminating together a semiconductor chip forming an integrated circuit and a thin inductor.

A distribution type power supply IC used in a portable electronic instrument such as a portable telephone, digital camera, or digital video camera, or an individual power supply IC that compensates for deficiencies in a centralized power supply, is structured such that a power supply IC chip forming an integrated circuit of an output portion and a control portion is die-bonded to a lead frame or substrate, wire-bonded to a lead terminal of the lead frame or a terminal of the substrate by metal wire, and then sealed by resin. A DC/DC converter is then formed by externally attaching an inverter, capacitor, or the like separately to the power supply IC.

FIG. 7 is a sectional view showing the main parts of a conventional DC/DC converter. This drawing shows the constitution in which a semiconductor chip 51 such as a power supply IC, an inverter 53, and a capacitor, resistance, and so on, not shown in the drawing, are mounted on a printed circuit board 61.

The semiconductor chip 51 is adhered fixedly onto a supporting conductive plate 54 via Ag paste 56, whereupon a terminal electrode 51 of the semiconductor chip 54 and an external lead-out terminal 55 are connected by a metal wire 58. Sealing is then performed using a resin mold 59, and thus a power supply IC is formed. The supporting conductive plate 54 of the power supply IC and the rear surface of the external lead-out terminal 55 are adhered fixedly to a conductive pattern 62 of a printed circuit board 61 by solder 63, and terminals 53a of the inductor 53 are also adhered fixedly to the conductive pattern 62 of the printed circuit board 61 by the solder 63. In addition, the capacitor and resistance, not shown in the drawing, are adhered fixedly to the conductive pattern 62 of the printed circuit board 61. The inductor 53 is a laminated inductor or a flat-type inductor such as a spirally wound inductor, a solenoid inductor, or a toroidal inductor.

In this DC/DC converter, the semiconductor chip 51 serving as the power supply IC chip and the inductor 53 are provided alongside each other on the printed circuit board 61. Therefore, although the thickness is reduced, the occupied surface area increases. Hence, it is necessary to reduce the size (occupied surface area) of the DC/DC converter while keeping its thickness low when the DC/DC converter is to be installed in a portable electronic instrument.

A similar reduction in size is also required in a multi-function system LSI. In a system LSI, a large number of functions are concentrated on a single chip, leading to increase in the surface area and size of the semiconductor chip. In response to this problem, it has been reported that a size reduction can be achieved in a system LSI by laminating together a plurality of LSI chips and sealing them with resin. This technique is known as chip on chip, in which a small semiconductor chip is laminated onto a semiconductor chip. A pad electrode for connection to a lead and a first pad electrode for an internal interface are provided on the main surface of a large LSI chip, and a second pad electrode and a first pad electrode of a small LSI chip provided on the main surface are electrically connected by a wire. Thus, a part of the circuit required by the system LSI is mounted on the small LSI chip rather than the large LSI chip, and hence a desired function as a system LSI is realized using two LSI chips (for example, Japanese Unexamined Patent Application Publication No. 2004-7017).

Further, an ultra-small power conversion device (ultra-small DC/DC converter) has been realized by flattening magnetic induction components such as a coil (inductor) and a transformer to reduce the size thereof, and improving a method of mounting these components on a semiconductor substrate in which a semiconductor device is formed (for example, Japanese Unexamined Patent Application Publication No. H11-251157).

An ultra-small power conversion device (ultra-small DC/DC converter) in which a thin film inductor of a toroidal endless solenoid is laminated onto a laminated ceramic capacitor and a semiconductor chip is adhered fixedly thereon using a stud bump has also been reported (for example, Japanese Unexamined Patent Application Publication No. 2004-72815).

In relation to the portable electronic instruments mentioned above, demands have been made for further reductions in size, thickness, and cost. Hence, there is strong demand for reductions in size, thickness, and cost of components such as the power supply IC chip and inductor built into the instrument and the printed circuit board on which these components are mounted.

Further, Japanese Unexamined Patent Application Publication No. 2004-7017 relates to a structure in which a semiconductor chip is laminated on a semiconductor chip, but does not deal with a structure in which an inductor and a semiconductor chip are laminated together.

In Japanese Unexamined Patent Application Publication No. H11-251157 and Japanese Unexamined Patent Application Publication 2004-72815, a semiconductor chip and a thin inductor are adhered fixedly by a stud bump and thereby laminated together. Although the surface area is reduced in comparison with that of the structure shown in FIG. 7 through lamination, the thickness increases.

Further, to adhere the stud bump formed on the outer peripheral portion of the semiconductor chip and a terminal electrode formed on the outer peripheral portion of the inductor together fixedly, the sizes of the semiconductor chip and inductor must be aligned such that even when a semiconductor chip having a small active region is characteristically sufficient, for example, a large semiconductor chip must be provided in accordance with the size of the inductor, and therefore it is difficult to achieve cost reductions. Furthermore, the formation process of the stud bump is complicated, and therefore, manufacturing costs are high.

An object of the present invention is to solve the problems described above by providing a semiconductor device with an inductor having reduced size, thickness, and cost.

Further objects and advantages of the invention will be apparent from the following description of the invention.

SUMMARY OF THE INVENTION

With the present invention, a semiconductor device with an inductor that is small, thin, and low-cost can be manufactured by fixedly adhering a structure formed by fixedly adhering a semiconductor chip and a thin inductor together using an insulating DAF tape to a conductive plate, and connecting terminal electrodes formed on the semiconductor chip, terminal electrodes formed on the thin inductor, and external conductive terminals of a package respectively using bonding wires.

Further, by employing a laminated inductor having a thickness of no more than 0.6 mm as the inductor, and causing the bonding wires to extend laterally, a thin semiconductor device with an inductor having a height of no more than 1.2 mm can be manufactured.

By using this semiconductor device with an inductor, reduction in thickness, size, and cost of a DC/DC converter and a portable electronic instrument installed with the DC/DC converter can be achieved.

Further, by disposing the inductor so as to cover the power supply IC chip, external noise is absorbed by a ferrite substrate forming the inductor, and hence a DC/DC converter having excellent noise resistance to external noise can be provided.

To achieve the object described above, in the semiconductor device with the inductor formed by laminating together the semiconductor chip and the thin inductor, the thin inductor is adhered fixedly onto a supporting conductive plate by a first fixing material and the semiconductor chip is adhered fixedly onto the thin inductor by a second fixing material, or the semiconductor chip is adhered fixedly onto the supporting conductive plate by the first fixing material and the thin inductor is adhered fixedly onto the semiconductor chip by the second fixing material, wherein the terminal electrodes formed on the semiconductor chip and the inductor terminal provided on the supporting conductive plate or the thin inductor, and the terminal electrodes and external lead-out terminals, are respectively connected by lead wires.

Further, the thin inductor is preferably a laminated inductor.

Further, the laminated inductor is preferably formed by burying a coil wound into a spiral shape in a height direction in a magnetic insulating member. Further, a height of the laminated inductor is preferably no greater than 0.6 mm.

Further, when the first fixing material fixedly adheres the thin inductor to the supporting conductive plate, the first fixing material is preferably a conductive adhesive. When the first fixing material fixedly adheres the semiconductor chip to the supporting conductive plate, the first fixing material is preferably a conductive adhesive or an insulating adhesive, and the second fixing material is preferably an insulating adhesive.

Further, the conductive adhesive is preferably Ag paste or solder. Further, the insulating adhesive is preferably insulating DAF (Die Attach Film).

Further, the supporting conductive plate, the thin inductor, the lead wires, and the external lead-out terminals are preferably sealed by a resin mold such that a rear surface of the supporting conductive plate and a rear surface of the external lead-out terminal are exposed.

Further, a height from the rear surface of the supporting conductive plate to an upper surface of the resin mold is preferably no greater than 1.2 mm.

Further, the lead wires are preferably metal wires or aluminum wires.

BRIEF DESCRIPTION OF THE DRAWINGS

FIG. 1B is a sectional view of the main parts taken along line 1B-1B in FIG. 1A;

FIGS. 2A and 2B are plan views showing the main parts of a lead frame, wherein FIG. 2A is a plan view showing the main parts thereof prior to cutting, and FIG. 2B is a plan view showing the main parts thereof following cutting;

FIGS. 4A and 4B are constitutional diagrams of a semiconductor device with an inductor according to a second embodiment of the present invention, wherein FIG. 4A is a perspective view of the main parts thereof, and FIG. 4B is a sectional view of the main parts thereof taken along line 4B-4B in FIG. 4A;

FIGS. 5A and 5B are plan views showing the main parts of another lead frame, wherein FIG. 5A is a plan view showing the main parts thereof prior to cutting, and FIG. 5B is a plan view showing the main parts thereof following cutting;

DETAILED DESCRIPTION OF THE EMBODIMENTS

The present invention will be described below using embodiments.

First Embodiment

Figure 1A:
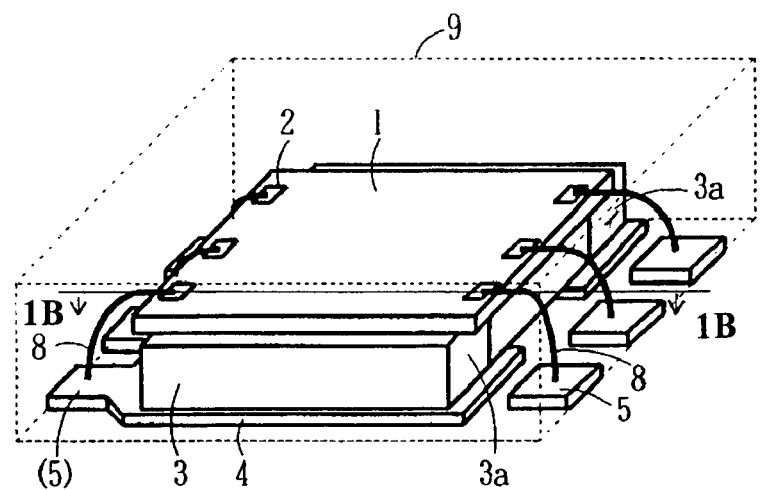
FIGS. 1A and 1B are constitutional diagrams of a semiconductor device with an inductor according to a first embodiment of the present invention, wherein 1A is a perspective view of the main parts thereof.
Figure 1B:
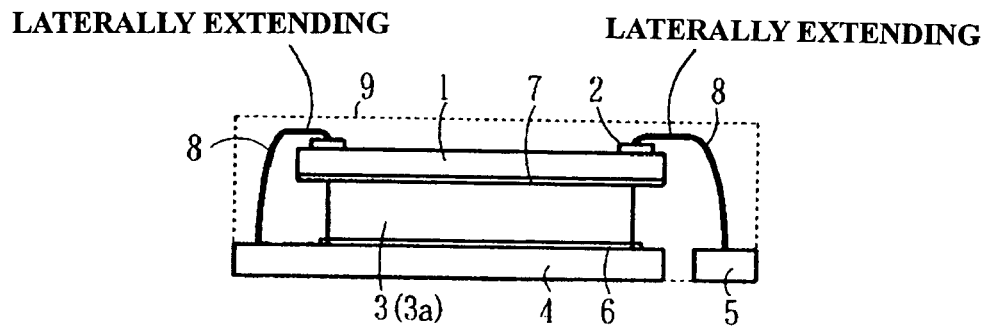

FIGS. 1A and 1B are constitutional diagrams of a semiconductor device with an inductor according to a first embodiment of the present invention, wherein FIG. 1A is a perspective view of the main parts thereof, and FIG. 1B is a sectional view of the main parts thereof taken along line 1B-1B in FIG. 1A.

A terminal 3a of a laminated inductor 3 is adhered fixedly onto a supporting conductive plate 4 by Ag paste 6, and a semiconductor chip 1 is adhered fixedly onto the laminated inductor 3 via insulating DAF tape 7. One end of the supporting conductive plate 4 serves as an external lead-out terminal 5, and this one end (the external lead-out terminal 5) of the supporting conductive plate 4 is connected to a terminal electrode 2 of the semiconductor chip 1 by a metal wire 8. Further, a plurality of terminal electrodes 2 of the semiconductor chip 1 and a plurality of individually provided external lead-out terminals 5 are connected respectively by metal wires 8. The entire structure is sealed by a resin mold 9. The metal wire 8 attached fixedly to the terminal electrode 2 of the semiconductor chip 1 extends laterally, parallel to the semiconductor chip 1 surface, and is connected to the external lead-out terminal 5. Note that solder may be used in place of the Ag paste 6. Further, aluminum wire may be used in place of the metal wire 8.

Figure 2A:
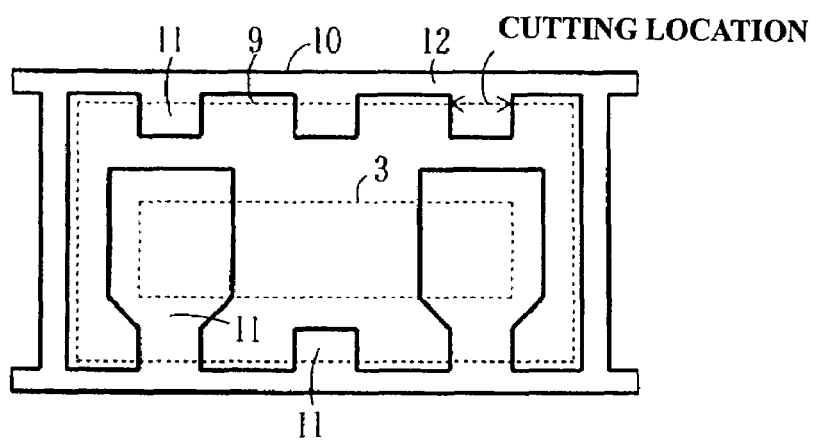
Figure 2B:
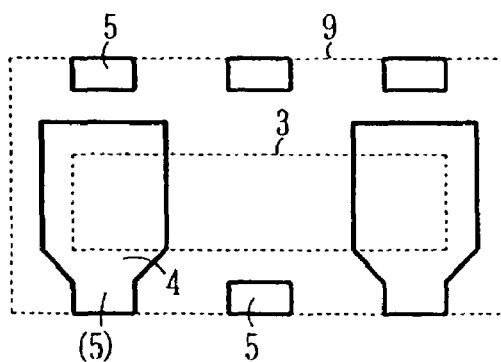

The supporting conductive plate 4 and external lead-out terminals 5 are inner leads 11, which are formed by fixedly adhering the laminated inductor 3 to a lead frame 10 shown in FIG. 2, fixedly adhering the semiconductor chip 1 thereon, bonding the metal wires 8, sealing the structure using the resin mold 9, and then cutting away the unnecessary lead frame 10.

Figure 3A:
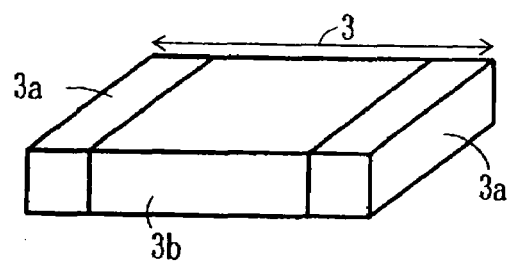
FIGS. 3A and 3B are structural diagrams showing the main parts of a laminated inductor.
Figure 3B:
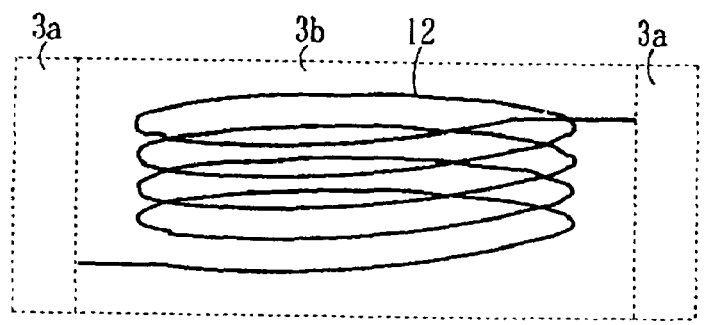

FIGS. 3A and 3B are structural diagrams showing the main parts of the laminated inductor. The laminated inductor 3 is structured such that a coil 12 extending in spiral form in the height direction is buried in an insulating magnetic member 3b such as a ferrite, and terminals 3a are provided at both ends thereof. A height H of the laminated inductor 3 is approximately 0.5 mm. Further, the inductance of the laminated inductor 3 is approximately 1 μH.

The semiconductor chip 1 is a distributed type power supply IC chip used in a portable electronic instrument or an individual power supply IC chip that compensates for deficiencies in a centralized power supply.

The thickness of the semiconductor chip 1 is approximately 0.14 mm, and the thickness of the supporting conductive plate 4 and external lead-out terminals 5 obtained by cutting the lead frame is approximately 0.15 mm. The distance between the surface of the semiconductor chip 1 and the surface of the resin mold 9 is approximately 0.18 mm. Hence, the overall thickness (height) of the semiconductor device with an inductor is approximately 0.97 mm, and even including the thickness of the Ag paste 6 and the insulating DAF tape 7, the thickness of the semiconductor device with the inductor is no greater than 1.00 mm. Even when variation occurs in the thickness of the various parts, the overall thickness can be held to or below 1.2 mm.

By employing the laminated inductor 3 and forming the wire (metal wire 8) to extend laterally in this manner, the thickness of the semiconductor device with an inductor can be reduced to or below 1.2 mm. To form the metal wire 8 to extend laterally, the wire (metal wire 8) is adhered fixedly to the terminal electrode 2 of the semiconductor chip 1 by an ultrasonic bonder, pulled out horizontally, and then adhered fixedly to the external lead-out terminal 5 by an ultrasonic bonder.

Further, since the semiconductor chip 1 is carried on the laminated inductor 3 and the terminals 3a of the laminated inductor 3 are directly connected to the supporting conductive plate 4, a wire connection is not required. Moreover, the semiconductor chip 1 and the wires are connected on the surface of the semiconductor chip 1, and therefore the semiconductor chip 1 is not restricted to the size of the laminated inductor 3, and may be smaller or larger than the laminated inductor 3. Hence, when the surface area of the required active region is small, a small semiconductor chip 1 may be carried on the laminated inductor 3, and as a result, a reduction in cost can be achieved.

Instead of the laminated inductor 3, a thin inductor such as a spirally wound inductor, a solenoid inductor, or a toroidal inductor may be used.

Further, the semiconductor device with an inductor is not limited to application in a DC/DC converter, and may be used in any other applications combining an inductor and an integrated circuit.

Second Embodiment

Figure 4A:
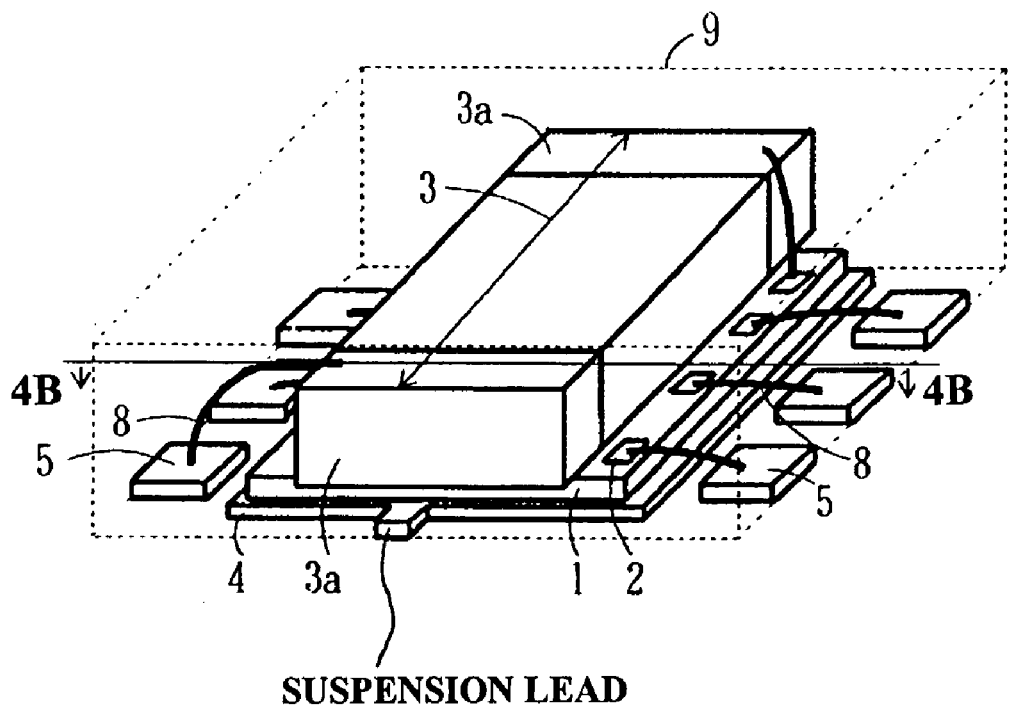
Figure 4B:
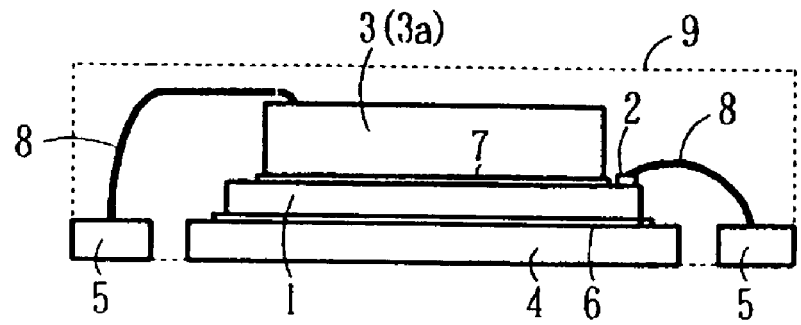

FIGS. 4A and 4B are constitutional diagrams of a semiconductor device with an inductor according to a second embodiment of the present invention, wherein FIG. 4A is a perspective view of the main parts thereof, and FIG. 4B is a sectional view of the main parts thereof taken along line 4B-4B in FIG. 4A.

The second embodiment differs from the first embodiment in that the laminated inductor 3 and semiconductor chip 1 are inverted such that the laminated inductor 3 is adhered fixedly onto the semiconductor chip 1. In this case, the semiconductor chip 1 must be made larger than the laminated inductor 3 in the locations of the terminal electrodes 2 formed on the outer peripheral portion of the semiconductor chip 1 so that the metal wires 8 can be bonded to the terminal electrodes 2. On the other hand, the laminated inductor 3 may protrude from the semiconductor chip 1 in the locations where the terminal electrodes 2 are not formed.

Further, in the second embodiment, the semiconductor chip 1 is adhered fixedly to the supporting conductive plate 4 via the Ag paste 6 or solder, and therefore heat generated by the semiconductor chip 1 can be diffused to the supporting conductive plate 4 efficiently. Accordingly, the second embodiment is suitable for a semiconductor chip 1 that generates a large amount of loss. In a semiconductor chip 1 that generates little heat, an insulating adhesive such as the insulating DAF tape 7 may be used instead of the Ag paste 6.

Figure 5A:
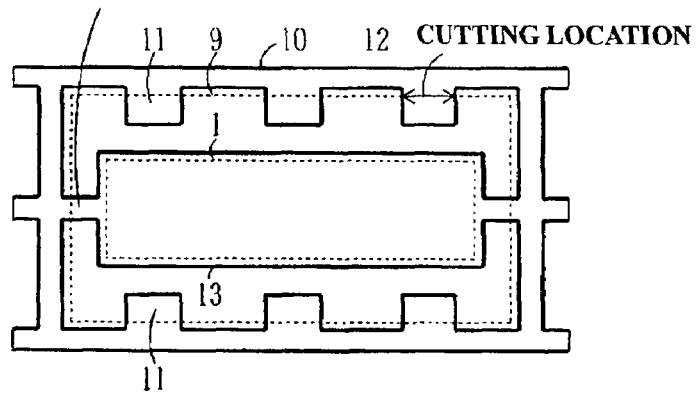
Figure 5B:
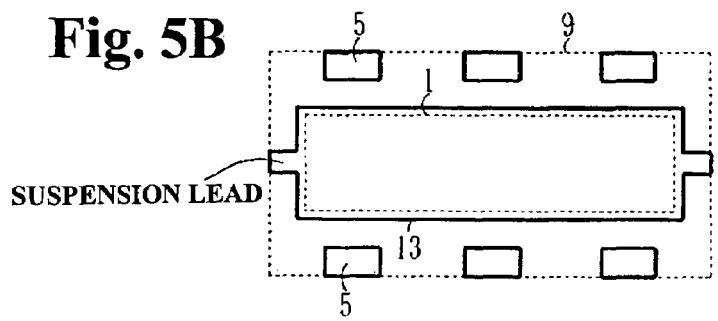

Note that the shape of the lead frame 10 is as shown in FIG. 5, and is different from that shown in FIG. 2. The reference numeral 13 in the drawing is a die pad to which the semiconductor chip 1 is adhered fixedly. Note that FIG. 5A is a plan view showing the main parts thereof prior to cutting, and FIG. 5B is a plan view showing the main parts thereof following cutting.

Third Embodiment

Figure 6:
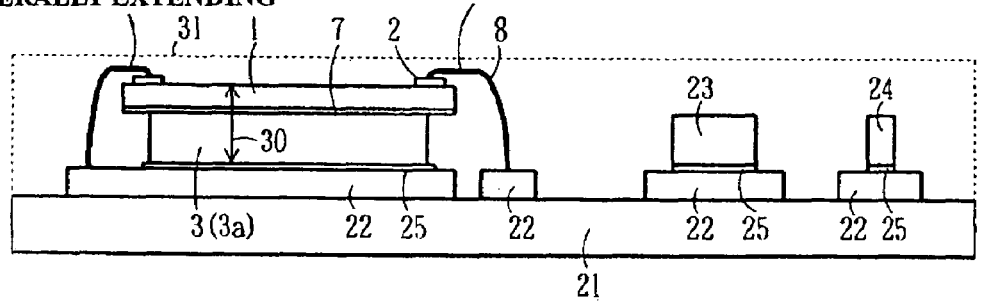
FIG. 6 is a sectional view showing the main parts of a semiconductor device with an inductor according to a third embodiment of the present invention.
Figure 7:
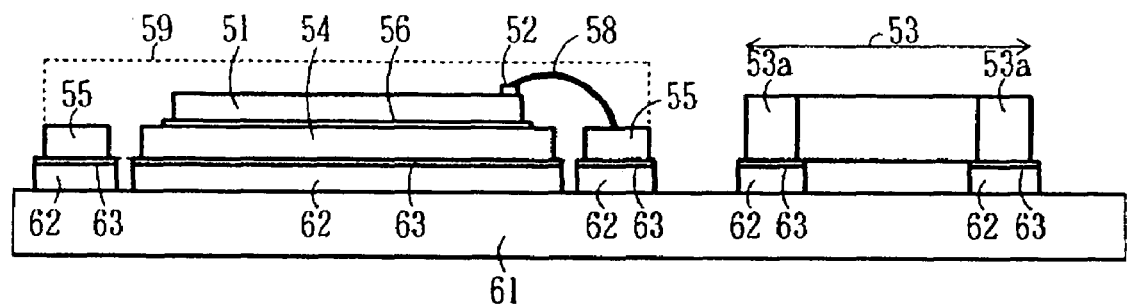
FIG. 7 is a sectional view showing the main parts of a conventional DC/DC converter.

FIG. 6 is a sectional view showing the main parts of a semiconductor device with an inductor according to a third embodiment of the present invention. In this example, the semiconductor device with an inductor is not sealed by resin. In the example in FIG. 6, a semiconductor device with an inductor 30 that is not sealed by a resin mold is adhered fixedly to a conductive pattern 22 of a printed circuit board 21 together with other components (a capacitor 23, a resistance 24, and so on) by a fixing material 25 such as solder, wherein the entire structure is sealed by a resin mold 31.

In this case, the laminated inductor 3 is adhered fixedly to the conductive pattern 22 of the printed circuit board 21 by the fixing material 25, and the terminal electrodes 2 of the semiconductor chip 1 are connected to the conductive pattern 22 of the printed circuit board 21 by the metal wires 8.

Thus, the semiconductor device with the inductor 30 may be adhered fixedly to the conductive pattern 22 of the printed circuit board 21 and used in a non-packaged state. With this constitution, the semiconductor device with the inductor may be applied to a conversion device other than the aforementioned DC/DC converter.

The disclosure of Japanese Patent Application No. 2005-267268 filed on Sep. 14, 2005 is incorporated as a reference.

While the invention has been explained with reference to the specific embodiments of the invention, the explanation is illustrative and the invention is limited only by the appended claims.

What is claimed is:

1. A semiconductor device with an inductor device, comprising:

a supporting conductive plate, a semiconductor chip having a terminal electrode, and a thin inductor laminating with the semiconductor chip, wherein said semiconductor chip or thin inductor is fixed onto the supporting conductive plate by a first fixing material, and said semiconductor chip is fixed with the thin inductor by a second fixing material, wherein the terminal electrode formed on said semiconductor chip and an inductor terminal provided on said supporting conductive plate or said thin inductor, and said terminal electrode and an external lead-out terminal, are respectively connected by lead wires, and wherein said supporting conductive plate is a lead frame on which said thin inductor or semiconductor chip is fixed chip by the first fixing material.

2. The semiconductor device with the inductor device according to claim 1, wherein said thin inductor is a laminated inductor.

3. The semiconductor device with the inductor device according to claim 2, wherein said laminated inductor comprises a coil wound into a spiral shape in a height direction, and a magnetic insulating member burying the coil.

4. The semiconductor device with the inductor device according to claim 3, wherein said laminated inductor has a height no greater than 0.6 mm.

5. The semiconductor device with the inductor device according to claim 1, wherein when said first fixing material fixedly adheres said thin inductor to said supporting conductive plate, said first fixing material is a conductive adhesive, when said first fixing material fixedly adheres said semiconductor chip to said supporting conductive plate, said first fixing material is a conductive adhesive or an insulating adhesive, and said second fixing material is an insulating adhesive.

6. The semiconductor device with the inductor device according to claim 5, wherein said conductive adhesive is Ag paste or solder.

7. The semiconductor device with the inductor device according to claim 6, wherein said insulating adhesive is an insulating die attach film.

8. The semiconductor device with the inductor device according to claim 1, wherein said supporting conductive plate, said thin inductor, said lead wires, and said external lead-out terminal are sealed by a resin mold such that a rear surface of said supporting conductive plate and a rear surface of said external lead-out terminal are exposed.

9. The semiconductor device with the inductor device according to claim 8, wherein a height from said rear surface of said supporting conductive plate to an upper surface of said resin mold is no greater than 1.2 mm.

10. The semiconductor device with the inductor device according to claim 1, wherein said lead wires are metal, gold or aluminum wires.

11. A semiconductor device with an inductor device, comprising:
    a supporting conductive plate,
    a semiconductor chip having a terminal electrode, and
    a thin inductor laminating with the semiconductor chip,
    wherein said semiconductor chip or thin inductor is fixed onto the supporting conductive plate by a first fixing material, and said semiconductor chip is fixed with the thin inductor by a second fixing material,
    wherein the terminal electrode formed on said semiconductor chip and an inductor terminal provided on said supporting conductive plate or said thin inductor, and said terminal electrode and an external lead-out terminal, are respectively connected by lead wires, and
    wherein said semiconductor chip is fixed to the supporting conductive plate, on which said thin inductor is fixed.

12. The semiconductor device with the inductor device according to claim 11, wherein said supporting conductive plate is a lead frame.

* * * * *